(12) United States Patent
Amir et al.

(10) Patent No.: US 9,093,458 B2
(45) Date of Patent: Jul. 28, 2015

(54) DEVICE CORRELATED METROLOGY (DCM) FOR OVL WITH EMBEDDED SEM STRUCTURE OVERLAY TARGETS

(71) Applicants: Nuriel Amir, St. Yokne'am (IL); DongSub Choi, Yongin (KR); Tal Itzkovich, Kfar Uria (IL); Daniel Kandel, Aseret (IL)

(72) Inventors: Nuriel Amir, St. Yokne'am (IL); DongSub Choi, Yongin (KR); Tal Itzkovich, Kfar Uria (IL); Daniel Kandel, Aseret (IL)

(73) Assignee: KLA-Tencor Corporation, Milpitas, CA (US)

( * ) Notice: Subject to any disclaimer, the term of this patent is extended or adjusted under 35 U.S.C. 154(b) by 223 days.

(21) Appl. No.: 13/776,550

(22) Filed: Feb. 25, 2013

(65) Prior Publication Data

US 2014/0065736 A1    Mar. 6, 2014

Related U.S. Application Data

(60) Provisional application No. 61/697,503, filed on Sep. 6, 2012.

(51) Int. Cl.
*H01L 23/544* (2006.01)
*H01L 21/66* (2006.01)
*G03F 7/20* (2006.01)

(52) U.S. Cl.
CPC .......... *H01L 23/544* (2013.01); *G03F 7/70633* (2013.01); *G03F 7/70683* (2013.01); *H01L 22/12* (2013.01)

(58) Field of Classification Search
USPC ............................................ 438/14; 257/797
See application file for complete search history.

(56) References Cited

U.S. PATENT DOCUMENTS

| | | | |
|---|---|---|---|
| 6,023,338 A | 2/2000 | Bareket | |
| 6,118,185 A | 9/2000 | Chen et al. | |
| 6,128,089 A | 10/2000 | Ausschnitt et al. | |
| 6,130,750 A | 10/2000 | Ausschnitt et al. | |
| 6,462,818 B1 * | 10/2002 | Bareket | 356/401 |
| 6,486,945 B1 | 11/2002 | Haerle et al. | |
| 6,486,954 B1 | 11/2002 | Mieher et al. | |
| 6,921,916 B2 | 7/2005 | Adel et al. | |
| 6,985,618 B2 | 1/2006 | Adel et al. | |

(Continued)

OTHER PUBLICATIONS

PCT International Search Report and Written Opinion for International Application No. PCT/US2013/058278, dated Dec. 30 2013, pp. 4-11, Korean Intellectual Property Office, Daejeon Metropolitan City.
U.S. Appl. No. 09/697,025, to Mehrdad Nikoonahad, filed Oct. 26 2000.
U.S. Appl. No. 61/697,503, entitled "Device Correlated Metrology (DCM) for OVL With Embedded SEM Structure Overlay Targets" to Nuriel Amir, filed Sep. 6, 2012.

*Primary Examiner* — Charles Garber
*Assistant Examiner* — Stanetta Isaac
(74) *Attorney, Agent, or Firm* — Joshua D. Isenberg; JDI Patent

(57) ABSTRACT

Aspects of the present disclosure describe a target for use in measuring a relative position between two substantially coplanar layers of a device. The target includes periodic structures in first and second layers. Differences in relative position of the first and the second layers between the first and second periodic structures and the respective device-like structure can be measured to correct the relative position of the first and the second layers between the first and second periodic structures. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

20 Claims, 6 Drawing Sheets

(56) References Cited

U.S. PATENT DOCUMENTS

| | | |
|---|---|---|
| 7,009,704 B1 | 3/2006 | Nikoonahad et al. |
| 7,408,642 B1 | 8/2008 | Dibiase |
| 2002/0080364 A1* | 6/2002 | Monshouwer et al. ....... 356/508 |
| 2002/0155356 A1 | 10/2002 | Fujimoto |
| 2003/0021467 A1 | 1/2003 | Adel et al. |
| 2003/0189705 A1 | 10/2003 | Pardo |
| 2003/0224261 A1 | 12/2003 | Schulz |
| 2005/0094145 A1 | 5/2005 | Lin |
| 2007/0076205 A1 | 4/2007 | Schulz |
| 2012/0033215 A1 | 2/2012 | Kandel et al. |

* cited by examiner

DEVICE CORRELATED METROLOGY (DCM) FOR OVL WITH EMBEDDED SEM STRUCTURE OVERLAY TARGETS

CLAIM OF PRIORITY

This application is a nonprovisional of and claims the priority benefit of commonly owned, co-pending U.S. Provisional Patent Application No. 61/697,503, to Nuriel Amir et al, filed Sep. 6, 2012, and entitled "DEVICE CORRELATED METROLOGY (DCM) FOR OVL WITH EMBEDDED SEM STRUCTURE OVERLAY TARGETS" the entire disclosures of which are incorporated herein by reference.

FIELD OF THE INVENTION

Embodiments of the present invention relate to overlay measurement techniques used in semiconductor manufacturing processes, and more particularly, to an apparatus and a method of overlay metrology for semiconductor lithographic applications, which incorporates optical overlay targets with SEM targets that mimic semiconductor device elements.

BACKGROUND OF THE INVENTION

In semiconductor fabrication industry, electronic devices may be produced by fabricating a number of layers on a substrate, some or all of the layers including various structures. There is a need to control alignment between various layers of samples, or within particular layers of such samples. The relative position of such structures both within particular layers and with respect to structures in other layers is relevant and critical to the performance of completed electronic devices. The relative position of structures within such a sample is generally called overlay.

The measurement of overlay error between successive patterned layers on a sample is one of the most critical process control techniques used in the manufacturing of integrated circuits and devices. Overlay accuracy generally pertains to the determination of how accurately a first patterned layer aligns with respect to a second pattered layer disposed above or below it and to the determination of how accurately a first pattern aligns with respect to a second pattern disposed on the same layer.

Various technology and processes for overlay measurements have been developed and employed with varying degrees of success. In general, overlay measurements are performed with test patterns that are etched into the layers. The images of these test patterns may be captured by an imaging tool and an analysis algorithm is used to calculate the relative displacement of the patterns from the captured images. One of the most commonly used overlay target pattern is the "Box-in-Box" target, which includes a pair of concentric squares (or boxes) that are built into scribe lines between adjacent dies on successive layers of the wafer. The overlay error is generally determined by comparing the position of one square relative to another square. Another example of an overlay target pattern is the "bar in bar" target, which includes a plurality of parallel bars on successive layers of the wafer.

Another example of an overlay target pattern is a grating-type target. The target usually includes a first periodic test structure and a second periodic test structure. The first periodic test structure is placed on a first layer of a device and the second periodic structure is placed on a second layer of the device adjacent the first periodic test structure when the second layer is placed on the first layer. Any offset that may occur between the first and second periodic test structures may be detected optically, micro-mechanically or with electron beams. Such grating style targets (sometimes referred to as "AIM" marks) can be denser and more robust, than "box" type marks resulting in the collection of more process information, as well as target structures that can withstand the rigors of CMP. The use of such marks is described, e.g., by Adel et al in commonly assigned U.S. Pat. Nos. 6,023,338, 6,921,916 and 6,985,618, all three of which are incorporated herein by reference for all purposes.

Additionally, some efforts have been made to utilize radiation scatterometry as a basis for overlay metrology. Certain existing approaches to determining overlay from scatterometry measurements concentrate on comparison of the measured spectra to calculated theoretical spectra based on model shape profiles, overlay, and film stack, and material optical properties or comparison to a reference signal from a calibration wafer. Alternatively, various implementations of sub-optical multi-cell targets have been employed.

Accuracy of the overlay measurement is still one of the major challenges faced by the overlay metrology in advanced integrated circuit manufacturing in the 2× and 1× nm process nodes. One of the main issues with accuracy is the bias between the overlay of the overlay target and the overlay of the real device. It is known in the industry to have overlay excursions which are only seen at end of line yield and not detected inline by the overlay metrology. It was found in several cases that such yield loss can occur due to change in the target to device bias, which is not detected by the traditional overlay target. Several methods have been implemented in the industry to check the real device overlay. For example, after device de-capping from the oxide protecting the previous layer, critical dimension scanning optical microscopy (CD-SEM) can measure the real device overlay directly. Another example is doing a cross section of the device and measuring the real overlay directly with a scanning electron microscope (SEM) or TEM (Transmission Electron Microscope). Electrical testing has also been employed to calculate device-like test structures overlay from resistance measurements. Each method however has its limitations. Accordingly, there are continuing efforts to develop improved overlay measurement techniques or methods that may increase accuracy of the measurement.

SUMMARY OF THE INVENTION

According to aspects of the present disclosure, a target for use in measuring a relative position between two substantially coplanar layers of a device includes a first periodic structure in the first layer with one or more windows for viewing portions of a periodic structure in a layer under the first layer. A first device-like structure is formed in the first layer within the first periodic structure. A second periodic is formed in the second layer on top of the first layer with one or more windows for viewing portions of the periodic structure in the first layer. A second device-like structure is formed in the second layer within the second periodic structure. The first and second periodic structures and the first and second device-like structures are configured such that differences in relative position of the first and the second layers between the first and second periodic structures and differences between the first and second device-like structures can be measured.

According to additional aspects of the present disclosure, a target for use in measuring a relative position between two substantially coplanar layers of a device includes a first periodic structure formed in a first layer and a second periodic structure formed in a second layer on top of the first layer. The first periodic structure includes one or more windows for viewing portions of a structure in a layer under the first layer. The second periodic structure includes one or more windows for viewing portions of the first periodic structure in the first layer. The first and second periodic structures are configured such that differences in the relative position of the first and the second layers between the first and second periodic structures can be measured.

According to further aspects of the present disclosure, a method may include forming a first periodic structure in a first layer with one or more windows for viewing portions of a periodic structure in a layer under the first layer. A first device-like structure may be formed in the first layer within the first periodic structure. A second periodic structure may be formed in a second layer on top of the first layer. The second periodic structure includes one or more windows for viewing portions the periodic structure in the first layer. A second device-like structure may be formed in the second layer within the second periodic structure.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Figure 1A:
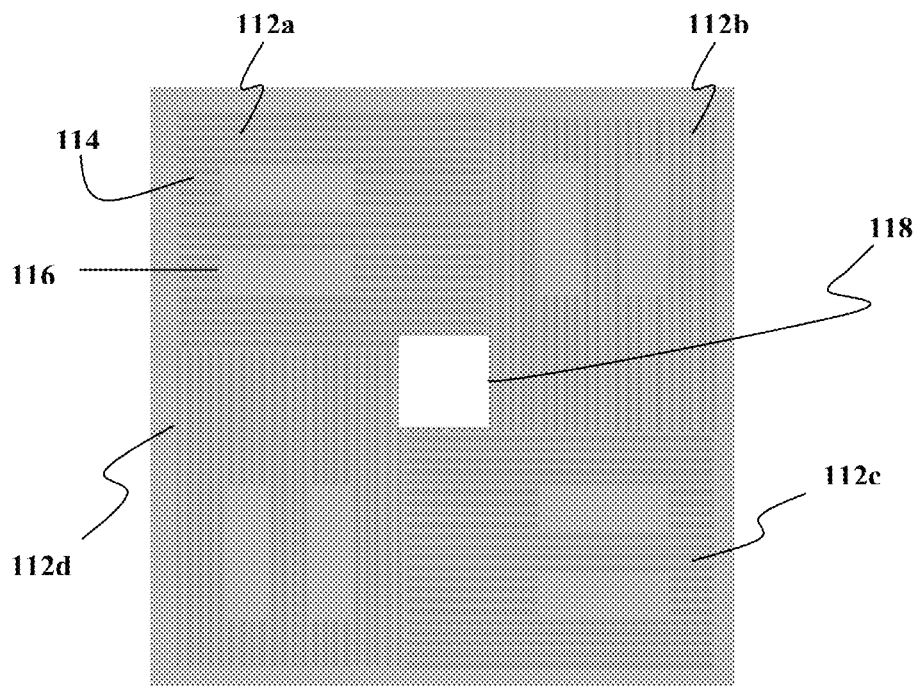
FIGS. 1A and 1B are schematic illustration of overlay targets for overlay measurements according to one embodiment of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. Additionally, because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims. "Optional" or "optionally" means that the subsequent described circumstance may or may not occur, so that the description includes instances where the circumstance occurs and instances where it does not. For example, if a device optionally contains a feature A, this means that the feature A may or may not be present, and thus, the description includes both structures wherein a device possesses the feature A and structures wherein the feature A is not present.

There are several practical difficulties to achieve the exact same overlay of a device by measuring the overlay of an overlay mark/target. One difficulty is that the current overlay measurement is performed on an overlay target, not on the real device pattern. Since the design of a device pattern is different from previous generation overlay targets, the lithographic influence e.g., image placement error and non-lithographic influence such as etch bias, are not identical. Another difficulty is that the overlay measurement is performed at After Develop Inspection (ADI) stage while a real device overlay is determined at After Etch Inspection (AEI), or even later in the process. The overlay target environment is also different. In particular, the overlay target is located in the scribe-line while the device pattern is located inside a die.

In light of the above, the present disclosure introduces a device correlate metrology (DCM) The purpose of the DCM described in the present disclosure is to measure the differences in overlay between the traditional overlay target and an accurate device like reference and use this difference to correct the OVL values given by the traditional method. Specifically, the DCM is a systematic approach to quantifying and overcoming the bias between target-based overlay results and the device overlay issues. For systematically quantifying the bias between the target and device, the embodiments of the present disclosure disclose a new hybrid target incorporating an optical overlay target with a device mimicking CD-SEM (Critical Dimension-Scanning Electron Microscope) target. The hybrid overlay target described below is configured to balance non-uniformities caused by the metrology tool (e.g., aberrations and illumination) and/or the process (e.g., dishing and erosion). Specifically, the hybrid overlay target is designed to accurately represent the process influence found on the real device. More specifically, the CD-SEM allows measuring the bias between the target and device on the same layer at AEI for all layers, the overlay between layers at AEI for most cases and at ADI for limited cases such as double patterning layers. Direct overlay measurements by CD-SEM show excellent correlation with optical overlay measurements. This correlation helps verify the accuracy of the optical measurement results and is applicable for imaging AIM, AIMid overlay and Scatterometry overlay (SCOL) methods.

Figure 1B:
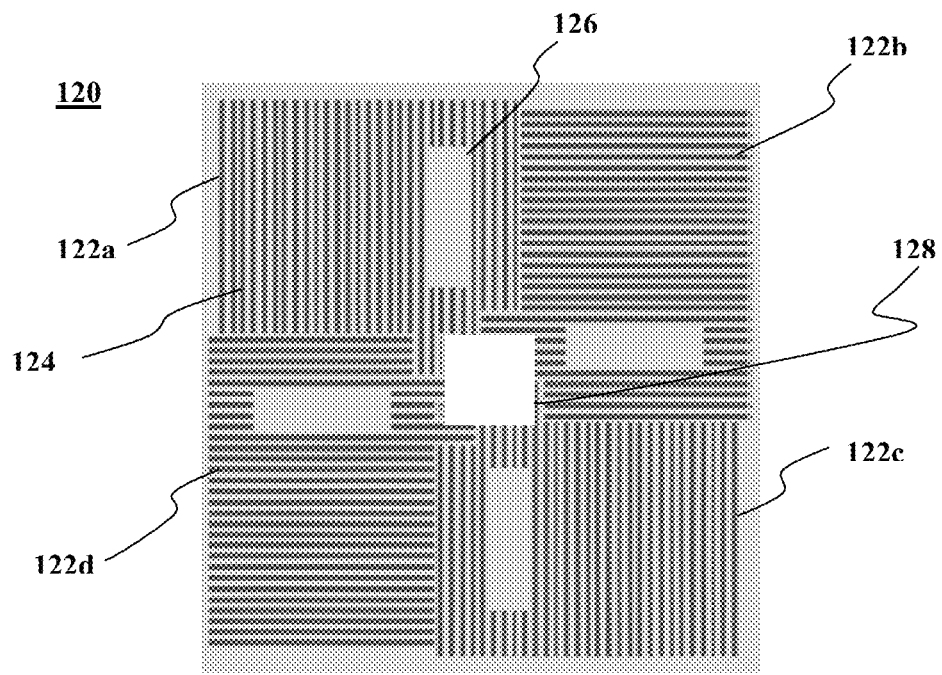

FIG. 1A is a schematic illustration of a hybrid overlay target in a first layer for overlay measurements according to one embodiment of the present disclosure. FIG. 1B is a schematic illustration of a hybrid overlay target in a second layer on top of the first layer for overlay measurements according to one embodiment of the present disclosure. For ease of discussion, the hybrid overlay targets will be described in context of measuring overlay between different layers of a substrate. It should be noted, however, that the hybrid overlay target may also be used to measure two or more separately generated patterns on a single layer of a substrate. It should be also noted that the following description on elements associated with FIG. 1A also applies to the corresponding elements in FIG. 1B.

The hybrid overlay target 110 of FIG. 1 is typically positioned inside the scribe lines separated from where the integrated circuit is patterned. The hybrid overlay target 110 is defined by a perimeter. The perimeter is typically based on metrology tool limitations and circuit design rules. For example, the upper limits of the perimeter may be set by the field of view (FOV) of the metrology tool used to measure overlay and/or the scribe line budget. The FOV generally refers to the optical perimeter that defines the area available for capturing an image via the metrology tool. The scribe line budget generally refers to the available space allowed by the scribe line for placing the overlay target. The lower limits of the perimeter may be set by the minimum area needed by the metrology tool to image the mark. It is generally believed that the perimeter should be as large as possible to maximize the amount of information used for overlay measurements. The size and shape of the perimeter may be widely varied. For example, the perimeter may form shapes such as squares, circles, triangles, rectangles, polygons and the like. The size of the perimeter may be between about 10 and about 100 microns depending on the metrology tool used.

The hybrid overlay target 110 includes an optical overlay mark and a device-like overlay mark 118 located in the middle of the hybrid target 110. The device-like overlay mark 118 may contain elements (e.g., fine segmented lines) that are about the same size and pitch (e.g., separation) as elements/structures of the actual integrated circuits. By way of example, the pitch in the device-like mark may be as small as the process allows, typically between about 5 nm, to about 80 nm, The linewidth in the device-like mark may be approximately the size of a device line, for example, between about 2 nm to 40 nm.

Figure 2:
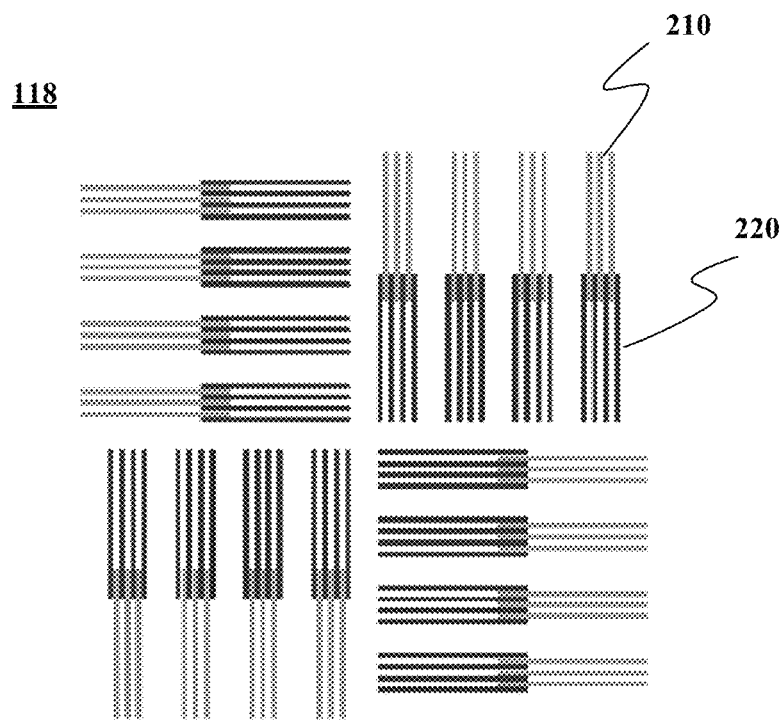
FIG. 2 is a top plan view of a device-like mark as part of an overlay target for overlay measurements according to one embodiment of the present disclosure.

FIG. 2 shows one example of a device-like overlay mark 118 that may be placed in the center of the hybrid overlay target 110. The different shaded thin lines in FIG. 2 are in targets in different layers. In particular, the lightly shaded lines 210 maybe printed as a device-like target in a first layer and the darkly shaded lines 220 may be printed as a device-like target in a second layer placed on top of the first layer. As shown in FIG. 2, the device-like overlay mark may be configured such that a portion of some lines 220 in the second layer interdigitate with portions of lines 210 in the second layer when the parts of the overlay mark 118 in the different layers are sufficiently aligned. The advantage to incorporating a device-like overlay mark 118 in the hybrid overlay target 110 is that it allows to perform a direct measurement of the device overlay by, for example, CD-SEM, which provides better accuracy and precision than optical overlay mark. Located in the middle of the hybrid overlay target 110, the device-like overlay mark 118 is well protected by the patterns surrounding it, which makes it more robust to polishing processes. Alternatively, the device-like overlay mark 118 may be located somewhere near the optical overlay mark, instead of being embedded into the optical overlay mark as shown in FIG. 1A.

The hybrid overlay target 110 includes an optical overlay mark in addition to a device-like mark because the optical overlay target uses wider lines. Wide tend to be printed more reliably than thin lines and are therefore more tolerant of process variation induced by CMP and etch-related deterioration. The optical overlay mark may be an imaging overlay target or a scatterometry overlay target. Referring back to FIG. 1A, the optical overlay mark may include a plurality of working zones 112a, 112b, 112c and 112d. The working zones may be configured to divide and substantially fill the perimeter of the target 110, except for a center of the target 110. The working zones 112a, 112b, 112c and 112d represent areas of the optical overlay mark that are used to calculate alignment between different layers of the wafer by optical overlay measurements. The working zones may be spatially separated from one another so that they do not overlap portions of an adjacent working zone. This is typically done to ensure that each of the working zones is properly imaged by the metrology tool. By way of example, the size of the working zones is generally between about 2 to about 24 microns for four working zones. In most cases, the size of the working zones is inversely proportional to the number of working zones. The shape of the working zone may very according to the specific needs of each optical overlay mark. By way of example, the working zones may have a square shape, an L shape, a rectangular shape, a triangular shape, a circular shape, a polygonal shape and the like. The shape and size of the working zones may be identical to each other.

Each of the working zones 112 of an optical overlay mark contains an individual periodic structure which includes a plurality of coarsely segmented lines 114 that increase the amount of information used for optical overlay measurements. The optical overlay mark is configured to measure overlay in two separate directions. The segmented lines 114 in working zones 112a and 112c may be oriented in one direction, e.g., the horizontal direction in FIG. 2. The segmented lines 114 in working zones 112b and 112d may be oriented in another direction, e.g., the vertical direction in FIG. 2. The dimensions of the pitch, linewidth and spacing may be widely varied. By way of example, the dimension of the pitch for a scatterometry overlay mark may be between about 150 nm and about 1000 nm, and the dimensions of the linewidth and spacing may be about ⅓ or ⅔ of the pitch. By way of example, the dimension of the pitch for an imaging overlay mark is typically less than the resolution of the imaging tool and can be as small as the device pitch such as between about 2 nm to about 40 nm. For certain optical overlay tools, such as AIM tools, the pitch in the imaging overlay mark has to be relatively large, such as in more than 2.5 microns. In addition, one or more windows/openings 116 may be formed on each working zone. The windows/openings 116 allow the patterns/segmented lines in the layer underneath the current layer to be exposed/viewed through the current layer for overlay measurements.

Similar to FIG. 1A, the hybrid overlay target 120 may include a device-like overlay mark 128 in the center of the target 120 and an optical overlay mark with four working zones 122a, 122b, 122c and 122d. Each of the working zones includes a periodic structure containing a plurality of coarsely segment lines 124. The second layer segmentation may be perpendicular to the first layer segmentation to avoid influence of one layer's signal on the other. One or more openings 126 may be formed on each of the working zone for exposing the patterns/segmented lines in the underneath layer.

Figure 1C:
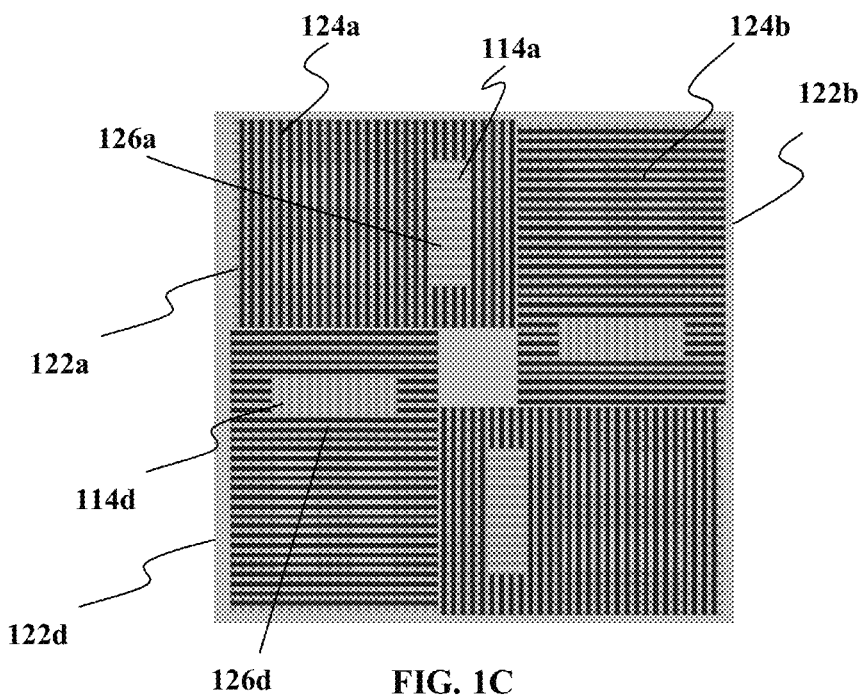
FIG. 1C is a top plan views of overlay targets for overlay measurements according to one embodiment of the present disclosure.

FIG. 1C is a top view of overlay targets for overlay measurements with the hybrid overlay target 120 of FIG. 1B in a second layer placed on top of the hybrid overlay target 110 of FIG. 1A in a first layer. With respect to the optical overlay mark, the segmented lines in one working zone may be aligned with one another viewed through from a window in the adjacent working zone. For example, the coarsely segmented lines 124 in the working zone 122b may align with the coarsely segmented lines 114 from the target 110 viewed through the window 126a in the working zone 122a. The coarsely segmented lines 124 in the working zone 122a may align with the coarsely segmented lines 114 from the target 110 viewed through the window 126 in the working zone 122d. The details of overlay measurements and calculations are discussed below.

Figure 3A:
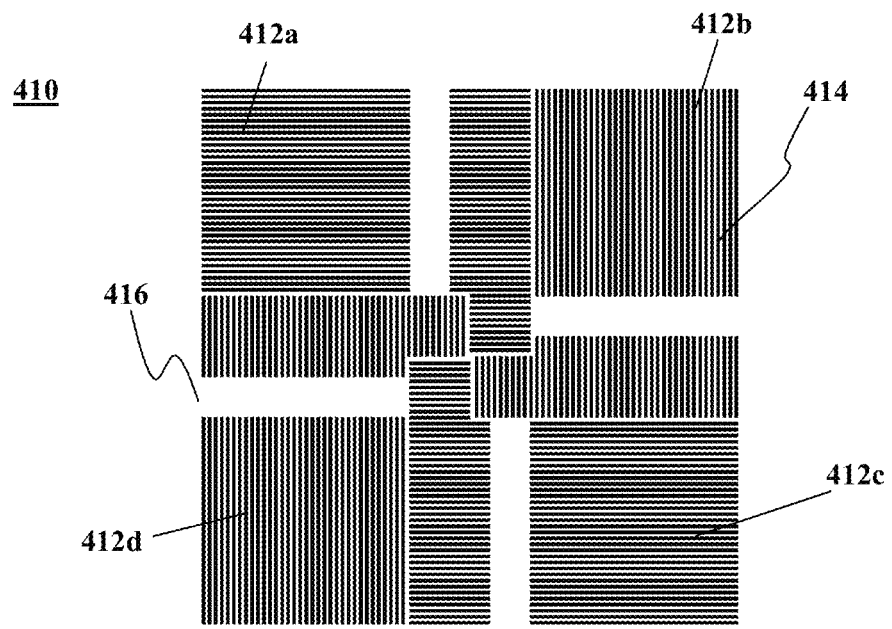
FIGS. 3A and 3B are schematic illustration of overlay targets for overlay measurements according to one embodiment of the present disclosure.
Figure 3B:
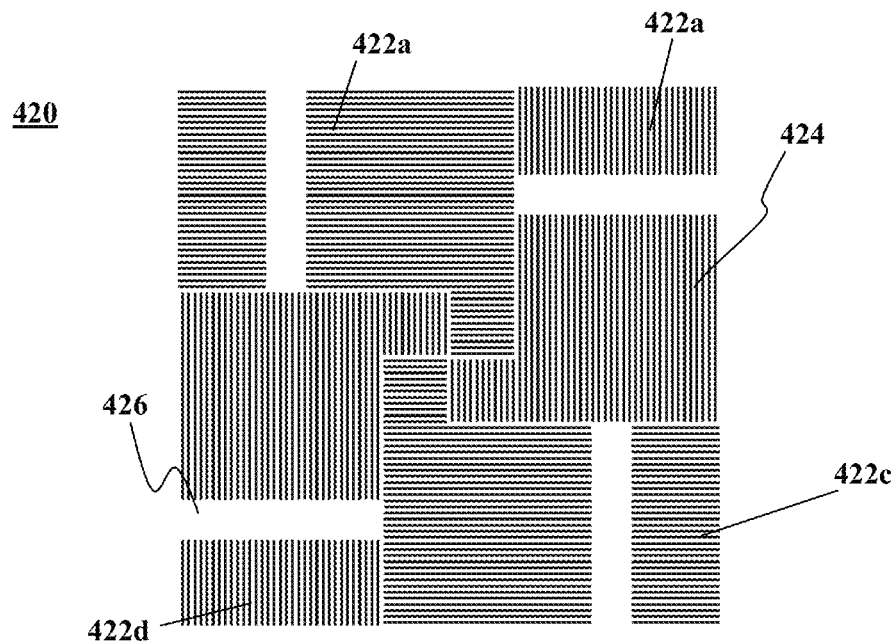
Figure 3C:
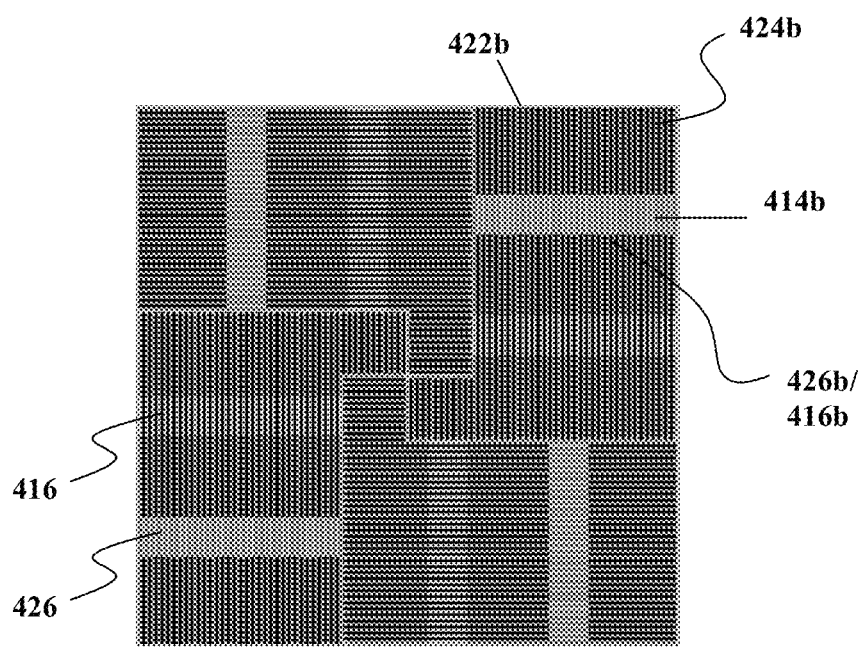
FIG. 3C is a top plan views of overlay targets for overlay measurements according to one embodiment of the present disclosure.

FIG. 3A is a schematic illustration of a hybrid overlay target in a first layer for overlay measurements according to another embodiment of the present disclosure. FIG. 3B is a schematic illustration of a hybrid overlay target in a second layer on top of the first layer for overlay measurements according to another embodiment of the present disclosure. FIG. 3C is a top view of overlay targets of FIGS. 3A and 3B with the second layer placed on top of the first layer. It should be also noted that the following description on elements associated with FIG. 3A also applies to the corresponding elements in FIG. 3B.

Unlike the embodiment described above associated with FIG. 1A, the overlay target 410 of FIG. 3A contains four working zones 412a, 412b, 412c and 412d with fine segmented lines 414 only and a plurality of large gaps 416. As an example, the size of each working zone may be about 4 µm×6 µm. The fine segmented line 414 forms a device-like overlay mark and the fine segmented lines 414 are about the same size and pitch (e.g., separation) as elements/structures of the actual integrated circuits. In one example, the pitch in the overlay target 410 may be about 0.1 µm. The gaps 416 provide a window through which the line pattern in the target below can be seen. Each of the gaps 416 may be about 0.8 µm in width. CD-SEM may be used to measure how well the fine segmented lines 414 in the target 410 line up with the fine segmented line in the target below. The fine segmented lines 414 fill up the most area of the overlay target 410 and thus provide CD-SEM with a larger area for overlay measurements. This would allow random errors to be filtered out by making measurements at several different places within the target.

In addition, the gaps 416 may be used as an optical overlay mark for overlay measurements. The pitch of the fine segment lines 414 is smaller than the resolution of the optical imaging tool, and thus, the individual lines 414 cannot be detected by the imaging tool. The gaps 416 are however larger than the tool resolution and can be detected by the imaging tool. As such, the gaps 416 may be used as optical overlay mark for measuring optically how well the gaps 416 in one target line up with the gaps in the target in the layer below. Similar to FIG. 3A, the hybrid overlay target 420 contains four working zones 412a, 412b, 412c and 412d with fine segments lines 424 and a plurality of large gaps 426.

FIG. 3C is a top view of overlay targets for overlay measurements with the hybrid overlay target 420 of FIG. 3B in a second layer placed on top of the hybrid overlay target 410 of FIG. 3A in a first layer. With respect to the optical overlay mark, the segmented lines in one working zone may be aligned with one another viewed through from a window in the same working zone. For example, the fine segmented lines 424b in the working zone 422b may align with the fine segmented lines 414b from the target 410 viewed through the window/gap 426b in same working zone. The gaps in the second layer may be aligned with corresponding gaps in the first layer. For example, the gap 426b from the target 420 may be aligned with the gap 416b from the target 410. Therefore, in addition to providing windows, the gaps 416, 426 may also act as convenient targets for conventional optical overlay measurements, if the gaps are wide enough to be resolved. For example, as shown in FIG. 3C, a displacement between gaps 416 and 426 may be measured with a conventional optical metrology overlay tool.

Figure 4:
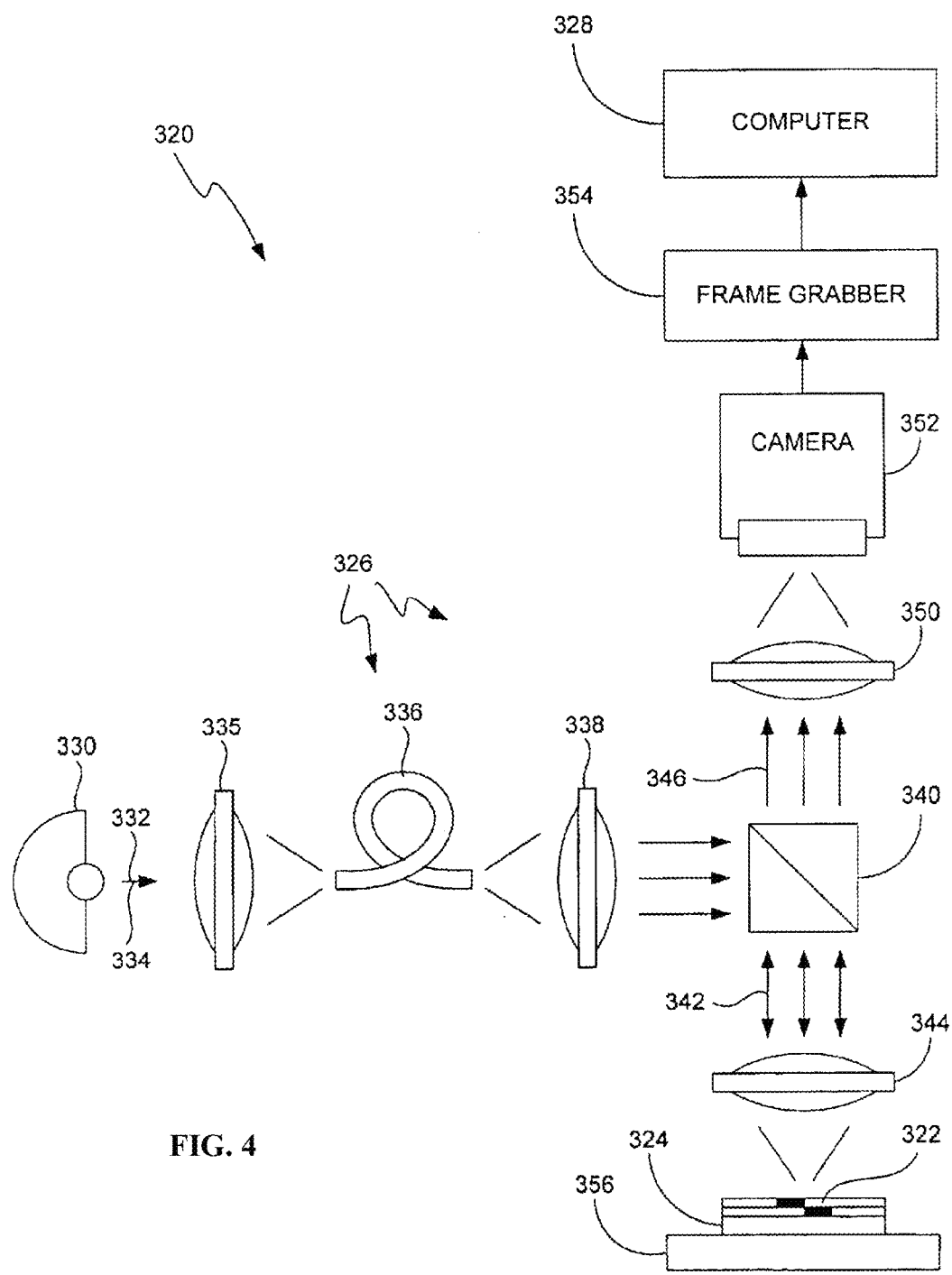
FIG. 4 is a simplified diagram of an example of an optical overlay measurement system or metrology tool that may be used to measure optical overlay marks in a hybrid overlay target according to one embodiment of the present disclosure.

As mentioned above, the absolute displacement measurements on device-like overlay marks may be measured using a high magnification microscope, such as a CD-SEM. There are a number of different techniques for measuring optical overlay marks. By way of example, FIG. 4 is a simplified diagram of an example of an optical overlay measurement system or metrology tool that may be used to measure optical overlay marks described above via imaging. Imaging is a very developed technology with large user acceptance, and components that are readily available to the user. The optical overlay measurement system 320 may be arranged to determine overlay error via one or more optical overlay marks 322 disposed on a wafer. In most cases, the optical overlay marks 322 are positioned within the scribe lines of the wafer 324. It should be noted that this is not a limitation and that the position of the targets may vary according to the specific needs of each device design. The optical overlay measurement system 320 may include an optical assembly 326 and a computer 328. The optical assembly 326 may be arranged to capture of the images of the optical overlay mark 322. The computer may be configured, e.g., through suitable programming, to calculate the relative displacement of the elements (e.g., coarsely segmented lines) of the overlay mark 322 from the captured images. The optical assembly 326 may include a light source 330 arranged to emit light 332 along a first path 334. The light 332 is made incident on a first lens 335, which focuses the light 332 onto a fiber optic line 336. When the light 332 emerges from fiber optic line 336, it then passes through a second lens 338, which is arranged to collimate the light 332. The collimated light 332 then continues on its path until it reaches a beam splitter 340, which is arranged to direct the collimated light onto a path 342. The collimated light 332 continuing a long path 342 is made incident on an objective lens 344, which focuses the light 332 onto the wafer 324. The light 332, which reflects off of the wafer 324, is then collected by the objective lens 344. The reflected light 332 that is collected by the objective lens 344 generally contains an image of a portion of the wafer 324, as for example, the image of the overlay mark 322. When the light 332 leaves the objective lens 344, it continues along path 342 until it reaches the beam splitter 340. The objective lens 344 manipulates the collected light in a manner that is optically reverse in relation to how the incident light was manipulated. That is, the objective lens 344 re-collimates the light 332 and directs the light 332 towards the beam splitter 340. The beam splitter 340 is arranged to direct the light 332 onto a path 346. The light 332 continuing on path 346 is then collected by a tube lens 350, which focuses the light 332 onto a camera 352. The camera records an image of the wafer 324, and more particularly, the image of the mark 322. By way of example, the camera 352 may be a charge couple device (CCD), a two-dimensional CCD, or linear CCD array. The camera 352 transforms the recorded image into electrical signals, which can be used by, and which are sent to the computer 328. After receiving the electrical signals, the computer 328 performs analysis algorithms that calculated the overlay error of the image. Analysis algorithms will be described in detail below.

The system 320 further includes a frame grabber 354 that works with the computer 328 and the camera 352 to grab images from the wafer 324. Although the frame grabber 354 is shown as a separate component, it should be noted that the frame grabber 354 may be part of the computer 328 and/or part of the camera 352. The frame grabber 354 typically has two functions-target acquisition and image grab. During target acquisition, the frame grabber 354 and computer 328 cooperate with a wafer stage 356 to place the target in focus and to position the target as close as possible to the center of the field of view (FOV) of the metrology tool. In most cases, the frame grabber grabs a plurality of images (e.g., not the images used to measure overlay) and the stage moves the wafer between these grabs until the target is correctly positioned in the X, Y and Z directions. As should be appreciated, the X&Y directions generally correspond to the field of view (FOV) while the Z direction generally corresponds to the focus. Once the frame grabber determines the correct position of the target, the second of these two functions is implemented (e.g., image grab). During image grab, the frame grabber 354 makes a final grab or grabs so as to capture and store the correctly positioned target images, i.e., the images that are used to determine overlay.

After grabbing the images, information must be extracted from the grabbed images to determine the registration error. The extracted information may be digital information or in waveforms. Various algorithms may then be used to determine the registration error between various layers of a semiconductor wafer. For example, a frequency domain based approach, a space domain based approach, Fourier transform algorithms, zero-crossing detection, correlation and cross-correlation algorithms and others may be used.

Algorithms proposed for determining overlay via the marks described herein (e.g., marks that contain periodic structures) can generally be divided into a few groups. For instance, one group may relate to phase retrieval based analysis. Phase retrieval based analysis, which is often referred to as frequency domain based approaches, typically involves creating one dimensional signals by collapsing each of the working zones by summing pixels along the lines of the periodic structure. Examples of phase retrieval algorithms that may be used are described in U.S. Pat. No. 6,023,338 issued to Bareket, U.S. Pat. 6,462,818 issued to Bareket, and U.S. Pat. No. 6,486,945 issued to Mieher, all of which are incorporated herein by reference.

Yet another phase retrieval algorithm that may be used is described in U.S. application Ser. No. 09/697,025 filed on Oct. 26, 2000, which is also incorporated herein by reference. The phase retrieval algorithm disclosed therein decomposes signals into a set of harmonics of the basic signal frequency. Quantitative comparison of different harmonics' amplitudes and phases provide important information concerning signals' symmetry and spectral content. In particular, the phase difference between the 1st and 2nd or higher harmonics of the same signal (calibrated with their amplitudes) measures the degree of the signal asymmetry. The major contributions to such asymmetry come from the optical misalignment and illumination asymmetry in the metrology tool (tool induced shifts), as well as process induced structural features (wafer induced shifts). Comparing this misregistration between the phases of the 1st and the 2nd harmonics for the signals acquired from different parts of the field of view on the same process layer may provide independent information about optical aberrations of the metrology tool. Finally, comparing these misregistrations from measurements at a given orientation with those obtained after rotating the wafer 180 degrees allows separation of the tool induced and wafer induced shifts due to asymmetry.

Yet another phase retrieval algorithm that may be used is Wavelet analysis. Wavelet analysis is somewhat similar to that described in the section above, however, now a dynamic window is moved across the one dimensional signal and the phase estimation is carried out in a more localized way. This is particularly of interest with use in the case of a chirped periodic structure.

Another group may relate to intensity correlation based methods. In this approach the centers of symmetry for each process layer is found separately by calculating the cross covariance of one signal with the reversed signal from the opposite part of the mark, from the same process layer.

The above techniques are brought by way of example and have been tested and demonstrated good performance. Other alternative algorithmic methods for calculation of overlay include other variations of auto & cross correlation techniques, error correlation techniques, error minimization techniques, such as minimization of absolute difference, minimization of the square of the difference, threshold based techniques including zero cross detection, and peak detection. There are also dynamic programming algorithms which can be used for searching for the optimal matching between two one-dimensional patterns. As mentioned above, the analysis algorithms and approaches may be utilized with respect to all of the various optical overlay marks described above.

Importantly, it should be noted that the above diagram and description thereof is not a limitation and that the overlay image system may be embodied in many other forms. For example, it is contemplated that the overlay measurement tool may be any of a number of suitable and known imaging or metrology tools arranged for resolving the critical aspects of overlay marks formed on the surface of the wafer. By way of example, overlay measurement tool may be adapted for bright field imaging microscopy, darkfield imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. These types of systems, among others, are readily available commercially. By way of example, single and multiple image methods may be readily available from KLA-Tencor of San Jose, Calif.

As mentioned above, the DCM reports the real device overlay considering both the measured overlay of the overlay target and the relative shift compared to real device overlay. The DCM basically has three main components.

A first DCM component a hybrid overlay target having a device-like mark that will behave similarly to real devices. Since pitch is one of the major factors for both lithographic and non-lithography behavior, the device-like overlay mark may be segmented with fine pitch, for example below 400 nm, to make sure it is not resolved by an optical overlay metrology tool. Preferably, the pitch is between about 15 nm and about 80 nm. There is a balance between having a big pitch and having a fine pitch. A big pitch is more process robust, especially in the scribe line areas where the process is less controlled. A fine pitch allows the target to behave more closely like the device during processing and measurement. The hybrid overlay targets may be design rule compatible in, for example, more than 90% of their area. Design rule compatibility, especially with advanced nodes, in conjunction with small target size, allows placing the targets also within the die itself.

A second component of DCM is measuring the overlay target correctly. Even for the same overlay mark, different overlay values may be reported under different measurement conditions. For example, different wavelength selection can report different overlay values, specifically when the overlay target exhibits asymmetry (for either the current layer or the previous layer). Therefore, it is desirable to optimize measurement conditions defined in the measurement recipe to provide the correct overlay. By way of example, model residuals are often used for determining the most accurate recipe or target. Another example to judge the accuracy is Qmerit algorithm which allows a quantitative measure of asymmetry impact. In addition, there are algorithms, such as the ASC (Archer Self Calibration) algorithm, that allow correcting for asymmetry and improving accuracy. A further example to choose the right recipe is improved ADI to AEI matching with a hybrid overlay target incorporating a device-like overlay mark to verify independently the measurement accuracy to avoid an overlay bias introduced by the etch process.

A third component of DCM is to accurately measure and generate a calibration map using the delta between reference overlay measurement (at AEI) and overlay value of the overlay target (at ADI). This calibration map can be used to modify the correction to the scanner, so the scanner compensates for difference and prints the device overlay more accurately. Reference OVL measurement may be done by CD-SEM result after de-cap, or electrical test result or x-section result of the real device. The device-like overlay mark allows to measure the process induced effects (litho and Etch) causing a shift between device like mark and optical overlay mark on the same layer. This shift is denoted as "Current/Previous AEI shift", as used in Equation (1) below. This shift should be measured in both previous and current layers and can be introduced into a calibration map between optical overlay measurement at ADI and the resulting device. Another element in the calibration map is the difference between optical AEI-ADI measurements. The calibration map will take the following form:

$$\text{Device AEI OVL} - \text{Target ADI OVL} = \text{Optical OVL}_{Target}(\text{AEI}) - (\text{Optical OVL}_{Target}(\text{ADI}) + \text{Previous AEI shift} + \text{Current AEI shift}) \quad \text{Eq (1)}$$

The method described in Equation (1) is general and can be used for most layers. Validation of the optical overly target may be done by CD-SEM at AEI, such as when the etch process removes and reveals a conducting element of the previous layer, or a few steps after AEI. Validation of the device-like overlay mark may also be measured by CD-SEM at AEI.

Figure 5:
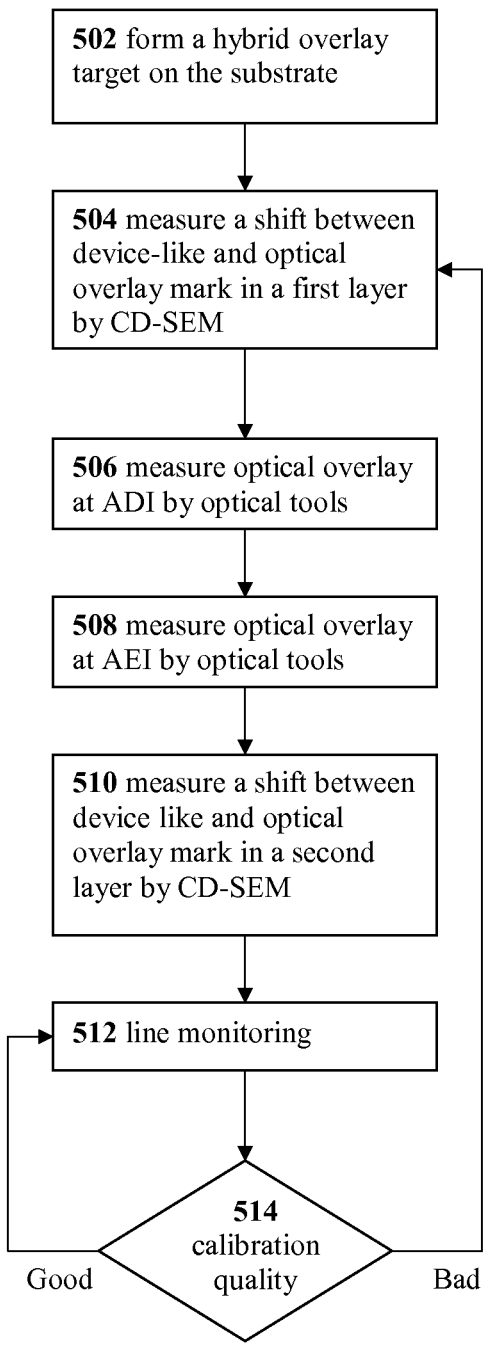
FIG. 5 is a flowchart of a method for performing an overlay measurement with a hybrid overlay target in accordance with the present disclosure.

FIG. 5 shows a flowchart of a method for performing an overlay measurement with a hybrid overlay target in accordance with the present disclosure. The method 500 may be used to perform a measurement of a relative position between two substantially coplanar layers of a device. At 502, a hybrid overlay target with an optical overlay mark and a device-like mark is formed in a layer on the substrate. By way of example, the first hybrid overlay target may be formed in a first layer of the device using, e.g., an optical reticle and conventional photolithography. The second hybrid overlay target may be formed in a second layer that lies on top of the first layer using, e.g., an imprint template. At 504, a shift between device-like and optical overlay mark in a first layer may be measured, e.g., by CD-SEM, at AEI or in other process steps. At 506, the overlay may be measured with the optical overlay mark at ADI using optical an optical overlay tool. An example of an optical metrology overlay tool is an Archer AIM Advanced Optical Overlay Metrology tool from KLA-Tencor Corporation of Milpitas, Calif.

At 508, the overlay may be measured with the optical overlay mark at AEI using an optical tool. The measurement may be taken at a point in the process when there is a pattern or even after exposure of a resist. At 510, a shift between device-like and optical overlay mark in a second layer may be measured by CD-SEM at AEI or in other process steps. A calibration map may be generated using such shift measurements taken at different locations on the substrate. Collecting shift data as discussed above allows one to follow the evolution of the shift through different process steps. The calibration quality may be determined at 512 by line monitoring, e.g., with standard ADI monitoring and/or a calibration map quality check. At 514, if the calibration quality is not good, a new calibration map may be generated. Otherwise, further line monitoring may be performed.

Aspects of the present disclosure provide for metrology targets that can be used to accurately measure device overlay. Taking the device overlay into account in the design of the overlay metrology target allows for improved speed and accuracy of overlay metrology. The improved speed and accuracy can lead to improved device yields and lower device costs.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

What is claimed is:

1. A target for use in measuring a relative position between two substantially coplanar layers of a device, wherein a second layer of the two substantially coplanar layers is located on top of a first layer of the two substantially coplanar layers, the target comprising:
a first periodic structure formed in the first layer, wherein the first periodic structure includes one or more windows for viewing a structure in a layer under the first layer;
a first device-like structure formed in the first layer within the first periodic structure;
a second periodic structure formed in the second layer, wherein the second periodic structure includes one or more windows for viewing portions of the first periodic structure in the first layer; and
a second device-like structure formed in the second layer within the second periodic structure, wherein the first and second periodic structures and the first and second device-like structures are configured such that differences in relative position of the first and the second layers between the first and second periodic structures and differences between the first and second device-like structures can be measured.

2. The target of claim 1, wherein first and second device-like structures are configured such that differences in relative position of the first and the second device-like structures can be measured by a critical dimension scanning electron microscope (CD-SEM).

3. The target of claim 1, wherein the first device-like structure and the second device-like structure include elements that are about same size and pitch as device elements of an integrated circuit.

4. The target of claim 1, wherein a pitch in the first device-like structure and the second device-like structure is between about 5 nm and about 80 nm.

5. The target of claim 1, wherein a linewidth in the first device-like structure and the second device-like structure is between about 2 nm and about 40 nm.

6. The target of claim 1, wherein the first device-like structure and the second device-like structure are respectively located in the middle portion of the corresponding periodic structure.

7. The target of claim 1, wherein the first periodic structure and the second periodic structure is configured as an imaging overlay target or a scatterometry overlay target.

8. The target of claim 1, wherein the first periodic structure and the second periodic structure include elements for optical overlay measurements.

9. The target of claim 1, wherein the first periodic structure and the second periodic structure are configured as a scatterometry overlay target, wherein a pitch in the first periodic structure and the second periodic structure is between about 150 nm and about 1000 nm.

10. The target of claim 1, wherein the first periodic structure and the second periodic structure are configured as a scatterometry overlay target, wherein a linewidth and spacing in the first periodic structure and the second periodic structure is between about 50 nm and about 700 nm.

11. The target of claim 1, wherein the first periodic structure and the second periodic structure are configured as an imaging overlay target, wherein a pitch in the first periodic structure and the second periodic structure is between about 2 nm and about 40 nm.

12. The target of claim 1, wherein the first periodic structure and the second periodic structure are configured as an imaging overlay target for an AIM tool, wherein a pitch in the first periodic structure and the second periodic structure is more than 2.5 microns.

13. A target for use in measuring a relative position between two substantially coplanar layer of a device, wherein a second layer of the two layers is located on top of a first layer of the two layer, the target comprising:
    a first periodic structure formed in the first layer, wherein the first periodic structure includes one or more windows for viewing portions of a structure in a layer under the first layer;
    a second periodic structure formed in the second layer, wherein the second periodic structure includes one or more windows for viewing portions of the first periodic structure in the first layer; and
    wherein the first and second periodic structures are configured such that differences in the relative position of the first and the second layers between the first and second periodic structures can be measured.

14. The target of claim 13, wherein the first periodic structure and the second periodic structure include elements that are about same size and pitch as elements of an integrated circuit.

15. The target of claim 13, wherein the first and second periodic structures are configured such that differences in the relative position of the first and the second layers between the first and second periodic structures can be measured by a critical dimension scanning electron microscope (CD-SEM).

16. The target of claim 13, wherein the windows in the first periodic structure are configured to align with corresponding windows in the second periodic structure for use in measuring a relative position of the first layer and the second layer.

17. A method, comprising:
    forming a first periodic structure in a first layer with one or more windows for viewing portions of a periodic structure in a layer under the first layer;
    forming a first device-like structure in the first layer within the first periodic structure;
    forming a second periodic structure in a second layer on top of the first layer, wherein the second periodic structure includes one or more windows for viewing portions the periodic structure in the first layer; and
    forming a second device-like structure in the second layer within the second periodic structure,
    wherein the first and second periodic structures are configured such that differences in the relative position of the first and the second layers between the first and second periodic structures can be measured.

18. The method of claim 17, further comprising measuring a shift between the first periodic structure and the first device-like structure and a shift between the second periodic structure and the second device-like structure.

19. The method of claim 17, further comprising measuring an overlay error with the first periodic structure and the second periodic structure after a developing step.

20. The method of claim 17, further comprising measuring an overlay error with the first periodic structure and the second periodic structure after an etch step.

* * * * *